United States Patent
Etienne et al.

(10) Patent No.: US 9,091,794 B2
(45) Date of Patent: Jul. 28, 2015

(54) OPTICAL TRAPPING FOR FIBER ILLUMINATION

(71) Applicants: Michael Etienne, Corning, NY (US); Claudio Mazzali, Painted Post, NY (US); William James Miller, Horseheads, NY (US); Daniel Aloysius Nolan, Corning, NY (US)

(72) Inventors: Michael Etienne, Corning, NY (US); Claudio Mazzali, Painted Post, NY (US); William James Miller, Horseheads, NY (US); Daniel Aloysius Nolan, Corning, NY (US)

(73) Assignee: Corning Incorporated, Corning, NY (US)

( * ) Notice: Subject to any disclaimer, the term of this patent is extended or adjusted under 35 U.S.C. 154(b) by 333 days.

(21) Appl. No.: 13/669,912

(22) Filed: Nov. 6, 2012

(65) Prior Publication Data

US 2013/0133744 A1     May 30, 2013

Related U.S. Application Data

(60) Provisional application No. 61/565,163, filed on Nov. 30, 2011.

(51) Int. Cl.
| | |
|---|---|
| *G02B 6/10* | (2006.01) |
| *F21V 8/00* | (2006.01) |
| *H01L 31/0232* | (2014.01) |
| *F21S 11/00* | (2006.01) |
| *H01L 31/054* | (2014.01) |

(52) U.S. Cl.
CPC ............ *G02B 6/0001* (2013.01); *F21S 11/007* (2013.01); *G02B 6/0006* (2013.01); *H01L 31/02325* (2013.01); *H01L 31/0547* (2014.12); *Y02E 10/52* (2013.01)

(58) Field of Classification Search
None
See application file for complete search history.

(56) References Cited

U.S. PATENT DOCUMENTS

| | | | |
|---|---|---|---|
| 3,656,844 A | 4/1972 | Botskor | |
| 3,656,884 A | 4/1972 | Okaya et al. | |
| 3,850,526 A | 11/1974 | Corey, III | |
| 4,297,000 A | 10/1981 | Fries | |
| 4,863,224 A * | 9/1989 | Afian et al. | 359/15 |
| 5,575,860 A * | 11/1996 | Cherney | 136/245 |
| 5,877,874 A * | 3/1999 | Rosenberg | 359/15 |
| 6,037,535 A | 3/2000 | Yoshino | |
| 6,299,317 B1 | 10/2001 | Gorthala | |
| 6,452,161 B1 | 9/2002 | Yedur et al. | |
| 6,957,650 B2 * | 10/2005 | Nyhart et al. | 126/600 |
| 7,369,735 B2 * | 5/2008 | Nyhart, Jr. | 385/131 |
| 7,391,939 B1 | 6/2008 | Williams | |
| 2011/0192447 A1 | 8/2011 | Shteyman | |

OTHER PUBLICATIONS

Springer et al., "Improved three-dimensional optical model for thin-film silicon solar cells"; Journal of Applied Physics; vol. 96, No. 9, pp. 5329-5337, 2004.

* cited by examiner

*Primary Examiner* — Sung Pak
(74) *Attorney, Agent, or Firm* — John L. Haack

(57) ABSTRACT

A light collection and light guidance system including:
a flat collecting sheet having a first roughened light receiving front surface; and
a plurality of optical fibers attached to at least one edge of the flat collecting sheet, wherein the first roughened light receiving front surface of the sheet has a plurality of resonance coupling periodicities, a plurality of correlation lengths, or a combination thereof. Also disclosed is a method of light collection and light guidance using the aforementioned system, or a system including a flat collecting sheet and a solar converter, as defined herein.

17 Claims, 4 Drawing Sheets

OPTICAL TRAPPING FOR FIBER ILLUMINATION

CROSS-REFERENCE TO RELATED APPLICATIONS

This application claims the benefit of priority under 35 U.S.C. §119 of U.S. Provisional Patent Application Ser. No. 61/565,163, filed Nov. 30, 2011, the content of which is relied upon and incorporated herein by reference in its entirety.

This application is related to commonly owned and assigned copending U.S. patent application Ser. No. 13/445, 250, filed Apr. 12, 2012, entitled PHOTOVOLTAIC DEVICE WITH SURFACE PERTURBATIONS CONFIGURED FOR RESONANT AND DIFFUSIVE COUPLING, but does not claim priority thereto.

The entire disclosure of any publication or patent document mentioned herein is incorporated by reference.

BACKGROUND

The disclosure relates to an apparatus and method for solar light collection and light guidance to illuminate a building interior.

SUMMARY

The disclosure provides an apparatus having a flat collecting sheet and a plurality of optical fibers attached to at least one edge of the flat collecting sheet, and a method of use for solar light collection and light guidance of the trapped light to illuminate a building interior.

BRIEF DESCRIPTION OF DRAWINGS

In embodiments of the disclosure.

DETAILED DESCRIPTION

Figure 1:
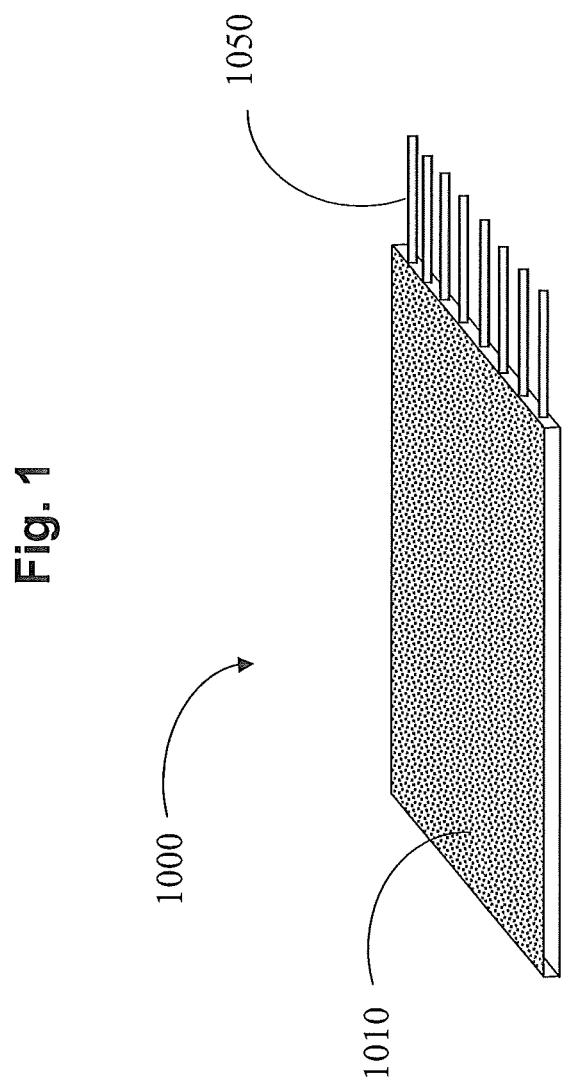
FIG. 1 shows a schematic in perspective of the disclosed fiber light system.

Various embodiments of the disclosure will be described in detail with reference to drawings, if any. Reference to various embodiments does not limit the scope of the invention, which is limited only by the scope of the claims attached hereto. Additionally, any examples set forth in this specification are not limiting and merely set forth some of the many possible embodiments of the claimed invention.

In embodiments, the disclosed apparatus or system, and the disclosed method of using provide one or more advantageous features or aspects, including for example as discussed below. Features or aspects recited in any of the claims are generally applicable to all facets of the invention. Any recited single or multiple feature or aspect in any one claim can be combined or permuted with any other recited feature or aspect in any other claim or claims.

"Include," "includes," or like terms means encompassing but not limited to, that is, inclusive and not exclusive.

"Consisting essentially of" in embodiments can refer to, for example:

a light collection and light guidance system, apparatus, or device, as defined herein; and a method of using the light collection and light guidance system for illuminating the interior of an environment or structure, as defined herein.

The indefinite article "a" or "an" and its corresponding definite article "the" as used herein means at least one, or one or more, unless specified otherwise.

Abbreviations, which are well known to one of ordinary skill in the art, may be used (e.g., "h" or "hr" for hour or hours, "g" or "gm" for gram(s), "mL" for milliliters, and "rt" for room temperature, "nm" for nanometers, and like abbreviations).

Specific and preferred values disclosed for components, dimensions, thickness, roughness, ingredients, additives, and like aspects, and ranges thereof, are for illustration only; they do not exclude other defined values or other values within defined ranges. The apparatus and methods of the disclosure can include any value or any combination of the values, specific values, more specific values, and preferred values described herein.

Solar illumination of fibers for the distribution of lighting in buildings is commercially available. However, these systems can be expensive in large part because of the need for solar tracking parabolic mirrors. The mirrors strive to track the sun throughout the day to efficiently focus the sunlight onto, for example, the multimode fibers that distribute the light. It is highly desirable to eliminate the active tracking and eliminate the expensive parabolic mirrors. Additionally, since the amount of solar energy captured is proportional to the illuminated area, it would be beneficial to simplify the collector design to maximize the total available area. Although potentially less efficient from a W/cm² perspective, the disclosed flat collector can be more adaptable in covering larger areas and in reducing overall cost of collecting.

In embodiments, the disclosure provides a light collection and light guidance system comprising:

a flat collecting sheet having a first roughened light receiving front surface; and a plurality of optical fibers attached to at least one edge of the flat collecting sheet, wherein the first roughened light receiving front surface of the sheet has a plurality of resonance coupling periodicities, a plurality of correlation lengths, or a combination thereof.

The sheet can have, for example, a modal volume (Vs), given by the volume of the sheet:

$$Vs = (n*2*\pi/\lambda)*\text{height}*\text{width}*\text{sqrt}(2\Delta s)$$

and is greater than or equal to (Vs≥Vf) the total modal volume (Vf) of the optical fibers given by:

$$Vf = N*n*2*\pi/\lambda*r^2*\text{sqrt}(2\Delta f)$$

where

N is the number of the fibers,

Δs (index of the sheet−1)/(index of the sheet) is the index delta of the sheet,

Δf (index of the core−index of the clad)/(index of the core) is the index delta of the fibers, and the length and the roughness of the sheet's surface is sufficient to cause enough mode coupling so that at least 50% of the sheet's modal volume is filled.

The length and the roughness of at least one of the sheet's surface can be, for example, sufficient to cause enough mode coupling so that at least 50% of the sheet's modal volume is filled.

In embodiments, the aforementioned system can further comprise a lens system situated between the sheet and at least one of the fibers.

In embodiments, the aforementioned system can further comprise a second roughened back surface.

In embodiments, the aforementioned system can further comprise having the second roughened back surface being mirrored.

In embodiments, the aforementioned system can further comprise having, for example, 2 to 3 edges, or more for plurigons, of the sheet mirrored and having the fibers are attached to the remaining edges, for example, 2 or 1 un-mirrored edges.

In embodiments, the plurality of optical fibers can be attached to at least one edge of the flat collecting sheet comprise about 10 to about 90% of the available surface area.

In embodiments, the plurality of optical fibers attached to at least one edge of the flat collecting sheet can comprise a close packed array.

In embodiments, the plurality of optical fibers can be, for example, attached to two or more edges of the flat collecting sheet.

In embodiments, the plurality of optical fibers can be, for example, attached to all edges of the flat collecting sheet and the fibers are closely packed.

In embodiments, the flat collecting sheet can include, for example, at least one of a transparent or a translucent glass, a transparent or translucent plastic, a transparent or translucent composite, and like materials, or a combination thereof.

In embodiments, the plurality of optical fibers can be, for example, attached to an edge of the flat collecting sheet by end-butting the fibers against the sheet edge. In embodiments, the system having optical fibers attached to an edge of the flat collecting sheet by end-butting can further comprise a holder to positionally fix the fibers against the sheet edge.

In embodiments, the first roughened light receiving front surface of the flat collecting sheet can have, for example, a roughness of from about 50 to about 500 nanometers.

In embodiments, the plurality of resonance coupling periodicities can have, for example, a periodicity of from about 250 nanometers to about 10 microns.

In embodiments, the plurality of correlation lengths can be, for example, a group of frequencies having, either or preferably both of, a short period of from about 0.5 to about 1 microns, and a long period of from about 5 to about 10 microns.

In embodiments, the flat collecting sheet can have surface mechanical frequencies of from about 0.25 to about 20 microns.

In embodiments, the disclosure provides a method of light collection and light guidance using the above mentioned system, including, for example:

exposing the above mentioned system to ambient sun light, or other suitable source;

collecting a portion of the sun light contacting the system within the flat collecting sheet;

channeling a portion of the collected light to at least one of the plurality of optical fibers attached to at least one edge of the flat collecting sheet; and distributing the channeled collected light to a remote location.

In embodiments, the disclosure provides a light collection and light guidance system comprising:

a flat collecting sheet having a first roughened light receiving front surface; and a solar converter attached to at least one edge of the flat collecting sheet, wherein the first roughened light receiving front surface of the sheet has a plurality of resonance coupling periodicities, a plurality of correlation lengths, or a combination thereof.

The solar converter can include, for example, at least one of a photovoltaic device, a semiconductor device, and like devices, or a combination thereof.

In embodiments, the disclosure provides a light trapping system and methods of making and using the system. Specifically, the disclosed system uses optical trapping in a surface roughened sheet, such as glass, to collect trapped light and thereafter transmit and distribute the trapped light using customized optical fibers attached to the edges of the sheet. The sheet's surface roughness parameters are selected so that tracking of the sun's angular position is unnecessary. The customized fibers typically have a large numerical aperture and a large core diameter. The fibers can have, for example, a core diameter on the order of 100 microns, such as from 50 to 150 microns, including intermediate values and ranges and a numerical aperture (NA) of at least 0.25, and preferably more, such as from 0.26 to 0.35, and from 0.26 to 0.4, including intermediate values and ranges. Also, significantly, the customized fibers scatter light out into an interior environment into which they are placed. To accomplish this scattering, light scattering sites can be incorporated into the core or the core clad interface. The sheet's surface roughness parameters are designed so that tracking of the sun's angular position is unnecessary. The light can be transported within the attached fibers and can be used for a variety of illumination and light transmission applications, such as in buildings.

The disclosed light trapping system and methods are advantaged by eliminating expensive solar tracking mirrors. The tracking mirrors can be eliminated by using optical trapping in roughened sheet glass. By selecting the appropriate surface roughness properties for the collector sheet the system can efficiently capture solar light. By defining, designing, and using the appropriate surface correlation length and surface rms roughness height properties, the optical trapping is essentially independent of the angle of the sun.

Referring to the Figures, FIG. 1 shows a schematic in perspective of the disclosed fiber light system (1000). A collection sheet (1010) having modified major surfaces or faces collects light and directs the collected light to one or more optical fibers (1050) attached to one or more edges of the collection sheet (1010). For example, solar light, can be scattered and then trapped in the sheet, such as a glass sheet. The trapped light then propagates to the attached optical fibers (1050). In embodiments, the at least one or more optical fibers (1050) can be a plurality of optical fibers forming an array of fibers. The array of fibers can be unidirectional or multidirectional, such as having fibers attached to two or more edges of the sheet.

FIGS. 2A and 2B show elevational views (left side—edge 2A; right side—end 2B) of the fiber lighting system (1000) of FIG. 1. The collection sheet (1010) includes a transparent interior sheet (1005) having a first roughened major surface (roughened surface) (1020) on the side of the sheet contacted by one or more beams (1105, 1125), of an external radiation source (1100, 1120), and a second roughened major surface (roughened surface) (1030) on the side of the sheet opposite the first roughened surface (1020). In embodiments, the second roughened major surface (roughened surface) (1030) on the side of the sheet opposite the first roughened surface (1020) can optionally have mirrored backing surface (1040) finish facing toward the interior of the collection sheet. The mirrored backing surface (1040) finish facing toward the interior of the collection sheet can be highly beneficial in directing more photons (light quanta) toward the optical fiber(s) per unit of light exposure time.

The external radiation source can be, for example, a near radiation source (1100), a distant radiation source (1120), an intermediate distance source (not shown), or a combination thereof. The external radiation source can provide, for example, one or more beams which impinge on the first surface of the system, such as a near beam (1105), a distant beam (1125), an intermediate distant beam (not shown), or a combination thereof. The near beam (1105) can be diffracted in to one or more internal beams (1110). The distant beam (1125) can be diffracted in to one or more internal beams (1120). The intermediate beams (not shown) can be diffracted in to one or more internal beams (not shown). The aforementioned internal beams can be internally reflected toward one or more edges of the sheet and can be channeled into one or more of the attached optical fibers (1050) and the light collected in the fiber(s) can propagate (1060) down the length of the fiber.

Figure 2:
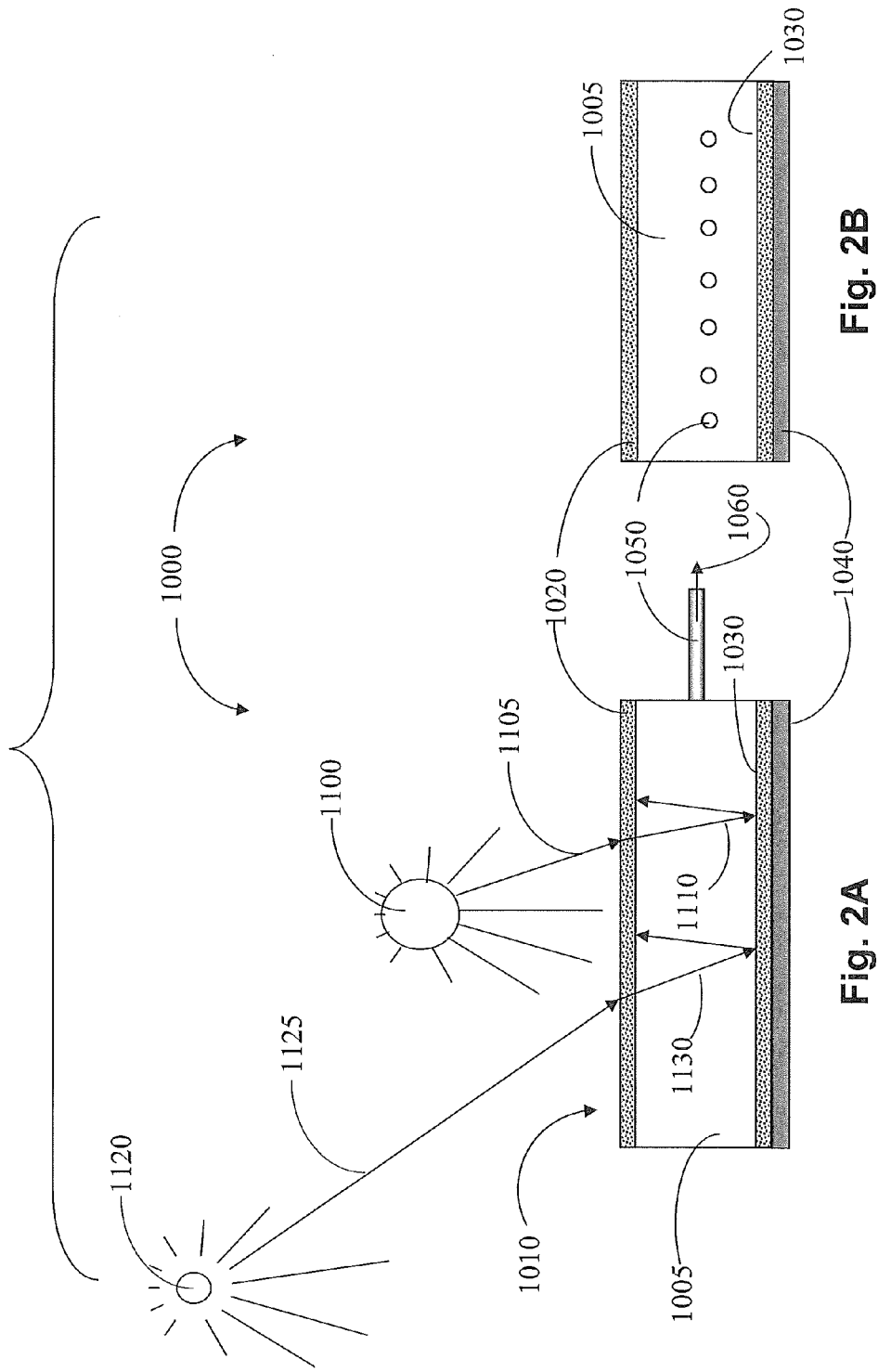
FIGS. 2A and 2B show elevation views, edge (2A) and side end (2B) of the fiber lighting system of FIG. 1.
Figure 3:
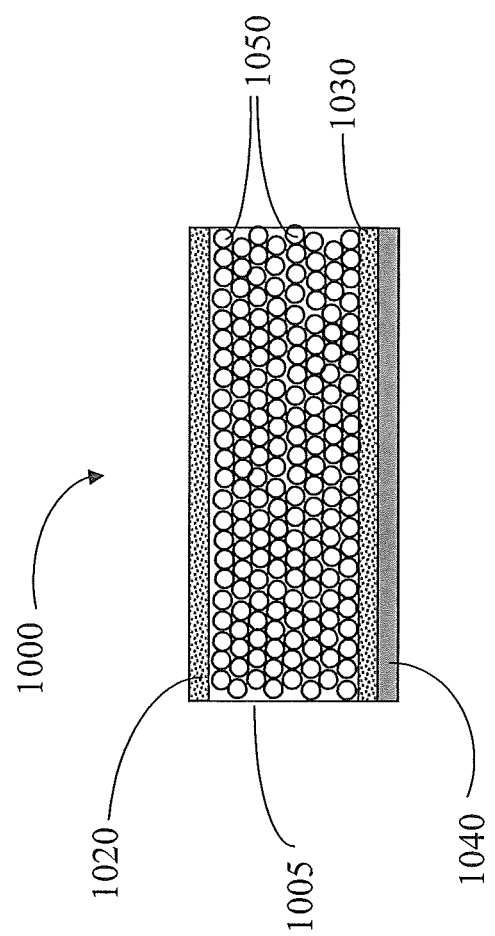
FIG. 3 shows an elevation view of a fiber light system having a similar structure of FIG. 1 and FIG. 2 but instead has a close packed or dense array of attached optical fibers.

FIG. 3 shows an elevational view of a fiber light system (1000) having the same structure of FIG. 1 and FIG. 2 with the exception that the attached optical fibers (1050) comprise a close packed or dense array of attached optical fibers (1050). The fiber light system (1000) includes a transparent interior sheet (1005) having a first roughened major surface (roughened surface) (1020) on the side of the sheet contacted by one or more light beams (not shown), of an external radiation source (not shown), and a second roughened major surface (roughened surface) (1030) on the side of the sheet opposite the first roughened surface (1020), and an optional mirrored backing layer (1040) on the second roughened surface (1030).

Figure 4:
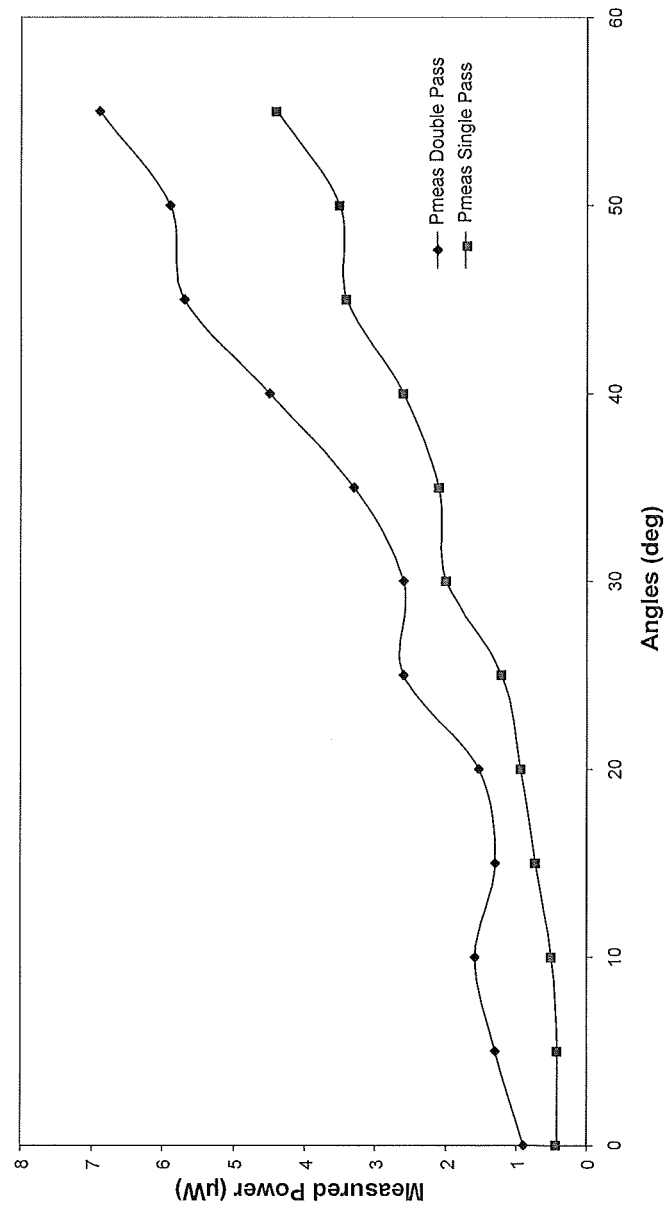
FIG. 4 shows an example of the amount of light scattered, trapped, and then captured in an attached fiber of a light collecting apparatus.

FIG. 4 shows the amount of light scattered, trapped, and then captured in an attached fiber, i.e., the single-pass and double-pass measured scattered power within a 62.5 micrometer multimode fibers (MMF) over from 0 to about 55 degrees incident angle. The double pass curve (top curve—diamonds) refers to the situation where, for example, a mirror is placed behind the glass sheet, or the back surface is mirrored. The single-pass curve (bottom curve—squares) refers to an un-mirrored back surface situation.

The increase in the amount of captured light with incident angle (e.g., 0 degrees is normal incidence) results because the correlation length of the surface roughness is significantly larger than the wavelength of the light by, for example, by a factor of about 2 to about 20. The correlation length of the surface roughness can be, for example, from about 0.5 microns to 20 microns, from about 0.5 microns to 15 microns, from about 0.5 microns to 10 microns, from about 0.5 microns to 5 microns, and from about 0.5 microns to 2.5 microns, including intermediate values and ranges. The wavelength of the light encompasses the solar gamut including, for example, visible, near IR, and near UV wavelengths of from about 0.3 microns to about 1.5 microns.

In embodiments, the system can have a collector sheet having a single roughened side, that is, only on the radiation receiving surface (1020). In embodiments, the system preferably, can be roughened on both sides of the sheet, i.e., the radiation receiving side and opposite (not direct exposure) side. In embodiments, more preferably the system can be roughened on both sides of the sheet, i.e., the radiation receiving side and opposite (not direct exposure) side, and the opposite side of the sheet, smooth or roughened can be mirrored. In embodiments, the roughened surface, receiving side, opposite side, or both, can be further coated with, for example a protective layer to prevent alteration or deterioration in the surface roughness properties and the trapping efficiency of the device. Alternatively or additionally, a surface coating on the roughened surface can be selected to further promote internal reflection, such as a one-way mirror finish or partial mirror finish facing or oriented toward the interior of the sheet.

FIG. 4 shows the amount of light input into a multimode fiber attached to a 3 mm×1 mm end-face of the roughened glass sheet shown FIG. 1. The two curves represent the measured data obtained with and without a mirror placed under the glass sheet. The amount of power captured by the attached fiber is significantly reduced by the broad width of the chip end face as compared with the area of the fiber core. In embodiments, there can be a large array of fibers at this end face. Also, in embodiments, the sheet made of glass can be selected to be roughened on only one side. Furthermore, the correlation length of the roughened glass can be, for example, on the order of about 5 microns. In embodiment, the correlation length can preferably be less than a micron, such as 0.5 to about 0.9 microns, to obtain light scattering that results in trapping. Current commercially available designs and devices can capture less than about 10% of light available for capture such as by directly shining the light into a fiber. Based on modeling, theory, and preliminary results it is believed that, in embodiments of the disclosure, this low level of capture can be improved by several orders of magnitude, such as to from about 15% to about 200% capture or more.

For significant solar capture, a device design should have a large capture surface area, which in turn requires low loss propagation of the captured light as it propagates to the end face or the edges of the sheet. To obtain low loss propagation, it is undesirable to have the light couple back out through the scattering surface. Theoretically, it was found that random surface scattering is favorable for this requirement. Trapped light striking the random surface at oblique angles scatters specularly, which leads to low loss propagation.

In embodiments, the present disclosure provides an apparatus or system and a method of using the system for optical trapping of light and transmission of the trapped light to and through one or more attached optical fibers, or alternatively, to one or more attached solar converters.

The collector sheet can be made of, for example, glass, plastic, composite, or other transparent or translucent materials that can collect the light and transmits the light to the in fibers attached to one or more edges of the collector sheet. As the trapped light propagates to the sheet edges, it 'down mode' couples in angular mode number to those angular modes that overlap the numerical aperture of the fiber.

Optical trapping in layered materials has been proposed as a means to improve the efficiency of solar cells (see for example, Springer, et. al., "Improved three-dimensional optical model for thin-film silicon solar cells," *J. of Applied Physics*, 96, #9, 5329-5337, 2004). The theory of the scattering of light from roughened surfaces has been developed (see for example, Beckmann, et al., "The scattering of electromagnetic waves from rough surfaces," Artech House, Inc., Chapter 5, 1987.)

The collection surface was characterized with an rms height parameter and a correlation length parameter. The transmitted and reflected light can be characterized with a specular and a diffracted component. Trapping results from the diffracted component. This diffracted component can only reflect light beyond the critical angle.

Modeling and Theory

Optical Trapping and Fiber Illumination

A primary aspect of the disclosure is to provide a system that enables light to be trapped in a sheet of glass and then propagate the light to an edge of the sheet where an array of fibers is attached, such as shown in FIG. 1.

To trap light, the light should be diffusely scattered at the sheet's surface. This can be achieved by, for example, roughening the surface of the sheet and as discussed further below. The roughed surface establishes frequency components that enable incoming light to be coupled from an unguided mode to a guided mode. This coupling is termed "phase matching," "phased matched," and like phrases.

An incoming ray propagates at a specific angle, and without a perturbed surface, this ray would propagate through (i.e., traverse) the sheet or slab as an unguided mode and exit the sheet glass again as the ray strikes the outer surface on the opposite or second surface, that is within or from the interior of the sheet. This unguided mode can be characterized with a propagation constant ($\beta$):

$$\beta = n 2\pi/\lambda \cos(\theta) \quad (1)$$

where n is the index of the material, $\lambda$ is the wavelength of the light, and $\theta$ is the angle of propagation. A trapped mode will propagate at a different angle compared to a ray in an unguided mode. The scattering surface can cause the light to couple from an unguided mode to a trapped mode. The difference in propagation constants of the two modes must be matched with a surface perturbation that has a component of frequency that matches this difference.

$$\beta_0 = n 2\pi/\lambda \cos(\theta_0) \quad (2)$$

$$\beta_t = n 2\pi/\lambda \cos(\theta_t) \quad (3)$$

So, there needs to be a frequency, f, in the surface structure that matches the difference in the two propagation constants.

$$f = \beta_0 - \beta_t \quad (4)$$

A randomly rough surface can be characterized with an "rms height" and a correlation length (see Beckmann supra.). The magnitude of the rms height determines the amount of diffusive light compared to the specular light. The correlation length determines the angles at which the light diffuses.

One significant problem addressed is that the same surface feature that couples the incoming light to a guided mode can also couple this guided mode to an unguided mode. The probability of the light coupling back out is proportional to the amount of light in that mode. To reduce the probability of this light being coupled back out, a second feature with a second effective correlation length can be introduced. This enables light to couple to another trapped mode. This lowers the intensity of the initial trapped mode and significantly reduces the probability of light being coupled back out.

Mathematically, one can decide this power exchange with the coupled mode equations. Each mode, i, has an amplitude which relates to the power (P) as:

$$P_i = \psi_i \psi_i^* \quad (5)$$

These $\psi_i$ represent the guided modes within the sheet (e.g., glass slab). The amplitude of the light impinging the surface of the sheet (e.g., glass surface) is a superposition of modes.

$$\Psi = \Sigma_m E_m(y,z), y \geq a \quad (6)$$

where a is the sheet thickness. Many modes exist within the sheet: $\psi_i, \psi_j, \psi_l \ldots$. The amplitude of each mode can be described with the coupled mode equations:

$$\partial \psi_i / \partial z = i\beta_i + \Sigma jk_{ij}\psi_j - k_{ij}\psi_i + \Sigma_m k_{im} E_m - k_{im}\psi_i \quad (7)$$

The $k_{ij}$ and $k_{im}$ quantify the coupling that occurs and is given by:

$$k_{ij} = \int \delta n \psi_i \psi_j dy \quad (8)$$

where $\psi_i$ and $\psi_j$ are orthogonal and describe the light without a perturbation. The perturbation $\delta n$ is caused by the surface roughness and varies in z with a frequency that matches the difference in the propagation constants.

It is significant to recognize that the average intensity of each mode cannot exceed that of the incoming light. So to increase the total power of light trapped in the sheet, one needs to couple light into as many modes as possible. To achieve this, the surface was designed so that light is coupled into each mode. The foregoing modeling discussion provides a basis for determining the proper surface frequencies or correlations that will result in the desired coupling. In embodiments, at a minimum, two correlation lengths or two frequencies are called for.

Surface Parameters

Here we quantify two surface parameters: the rms height or the root mean square height ($\sigma$) of the roughened structures and their mechanical frequency (f). These parameters can be used to describe the amount of light coupled into a trapped mode.

To get a significant amount of light coupled into a trapped mode, a significant amount of dispersive light transmission, dispersive light reflection, or both, needs to be generated compared to the amount of specular reflection.

The fraction of the dispersive light (D) according to Beckmann, supra., is:

$$D = 1 - \text{Exp}[-g]$$

here $$g^{0.5} = (2\pi n/\lambda)((\cos(\theta_1) + \cos(\theta_2))\sigma$$

where g is the difference in the propagation constants, or momentum of the light, times the rms height of the surface features. The minus sign results because the difference is between a vector quantity. Here, $\theta$ is measured from the plane of the surface and the parameter 1 refers to the incident angle and 2 to the reflected or transmitted angle. So for a numerical estimate, we take the angles to be zero, the index to be 1.5, and the wavelength of the light lambda ($\lambda$) to be 0.5 microns, and if g=1, then, $\sigma$=0.05 microns or 50 nanometers (nms), where $\sigma$ is the root mean square (rms), i.e., the square root of variance or the variance, or the variation of the surface height.

In the instance of transmission and using, as in Springer supra., we replace 2n above with $\Delta n$ the index difference between the two mediums. In this instance the $\sigma$rms height is about 300 nanometers.

To estimate the surface mechanical frequencies, we use $$f = \Delta \beta,$$

the difference in propagation constants ($\beta$) of an incoming solar ray with that of a trapped mode.

$$f = 2\pi/\lambda((\cos(\theta_i) - \cos(\theta_t))$$

For $\theta_{in}$=90 degrees and $\theta_{trapped}$=42 degrees, for the minimally trapped ray we have, f=12 inverse microns.

This gives a period of approximately 0.5 microns. For trapping to the deepest mode, this gives f=18 inverse microns, and a period of approximately 0.3 microns. For the longer period, a factor of 10 can be approximately used, i.e., providing a period of approximately about 5 microns.

EXAMPLES

The following examples serve to more fully describe the manner of making and using the system and method of the disclosure, and to further illustrate and demonstrate specific examples of best modes contemplated for carrying out various aspects of the disclosure. These examples do not limit the scope of the disclosure, but rather are presented for illustrative purposes.

Example 1

Procedure for Making a Light System

Sheet roughening. The sheet can be roughened on one or both sides by any suitable method. In embodiments, preferably both sides of the sheet are roughened.

Suitable sheet roughening methods can include and can be achieved by one or more of, for example, anti-glare surface treatment processes such as disclosed in commonly owned and assigned patent applications: U.S. Ser. No. 13/405,787, entitled GLASS HAVING ANTIGLARE SURFACE WITH LOW DISPLAY SPARKLE; U.S. Ser. No. 13/270,345, entitled ANTI-GLARE SURFACE TREATMENT METHOD AND ARTICLES; U.S. Ser. No. 61/484,326, entitled ANTI-GLARE GLASS ARTICLES AND DRY-MASK METHOD OF MAKING; U.S. Ser. No. 13/090,561, entitled ANTI-GLARE SURFACE TREATMENT METHOD AND ARTICLES THEREOF; U.S. Ser. No. 12/730,502, entitled GLASS HAVING ANTI-GLARE SURFACE AND METHOD OF MAKING; and U.S. Ser. No. 12/858,544, entitled GLASS AND DISPLAY HAVING ANTI-GLARE PROPERTIES, and which methods can provide a long period(s), varying periodicities, or both. Grinding methods can provide a short period(s). Other roughening methods, such as sanding, sand blasting, and like methods can be employed alternatively or additionally.

As mentioned above, the rms height required to cause coupling as the light transmits from air into the glass is different than what it needs to be on reflection once the light is already within the glass and mode coupling occurs on reflection. This difference gives a factor of 6. So we can have a combination of these frequencies in the surface roughness.

In embodiments, the second side or back side of the sheet can be mirrored by any suitable method, preferably after the first side, second side, or both sides have been roughened.

Joining the Sheet and the Fibers.

The fibers can be combined with the sheet in any suitable manner or method, for example, end-butted against the edge of the sheet and be held in place by any suitable means, such a holder, holster, or nest. The holder can, for example, accommodate both the sheet and the plurality of fibers, and stably hold the combined sheet and fibers in a fixed position relation. The holder can, for example, restrict one or more, or all degrees of freedom of movement of the combined sheet and fibers. The holder can be constructed by any suitable method and by any suitable material, for example, a metal, an alloy, a thermoplastic, a thermoset, an injection molded plastic, and like materials, such as an engineering resin, or like material.

The fibers can also be attached using a lens system (not shown) that ensures as much light as possible is coupled from the sheet into the fibers. This lens system is especially helpful if the fibers selected have a low numerical aperture. In the instance of fibers having low numerical aperture, the vertically stacked height of the fiber diameters needs to be larger than the sheet thickness due to the brightness theorem. Lens coupling is then needed for efficient coupling. In embodiments, the lens system can include, for example, one or more expanded beam connector situated between the sheet edge and each fiber.

Example 2

Procedure for Using the Light System

The disclosed light system calls for a situation such that enough ambient is light trapped in the sheet so that it is sufficient to illuminate the entire length of the attached fibers and so that it can illuminate the environment in which the fibers are distributed, such as a building, a dwelling, a mine, a cave, a windowless structure, a subterranean structure, and like structures in need of illumination. This means that the modal volume of the sheet times the length of the sheet, i.e., $(n*2*\pi/\lambda)*height*width$, is equal or greater than the modal volume of the fibers, $N*n*2*\pi/\lambda*r^2$ where N is the number of the fibers. The roughness of the sheet needs sufficient so that enough mode coupling occurs such that this illumination is concentrated at the sheet's edge where the fibers are attached.

In one exemplar, a large sheet of glass, such as about 1 square meter surface area or more on one side, having sufficient roughness and sufficient mode coupling, can couple the incoming sun light to nearly all the modes within the sheet. In this way all of the solar energy trapped by the light system will be concentrated at the sheet edge where the fibers are attached. The illumination can be, for example, from about 100 to about 1,000 standard 100 watt incandescent light bulbs. This light can then be distributed using the attached fibers to illuminate an environment.

In an illustrative demonstration, the sun can illuminate a sheet having a 1 square meter side with a magnitude of up to 100,000 lumens. If all of this light were to be collected and the distributed for illumination, it could provide the equivalent illumination of 10,000 watts or about 100 to about 1,000 standard 100 watt incandescent light bulbs. Fibers attached to this illuminated sheet can distribute this amount of illumination over a distance at which the light is scattered out from the core and into the environment. This is the situation for a thin sheet whose thickness approximately matches that of the fiber diameter. For a thicker sheet and with complete mode coupling within the sheet, and because the fibers can be stacked vertically as well as horizontally, it is possible to multiply this illumination value by the depth of the sheet divided by the diameters of the fibers.

The disclosure has been described with reference to various specific embodiments and techniques. However, it should be understood that many variations and modifications are possible while remaining within the scope of the disclosure.

What is claimed is:

1. A light collection and light guidance system comprising:
a flat collecting sheet having a first roughened light receiving front surface; and
a plurality of optical fibers attached to at least one edge of the flat collecting sheet wherein the first roughened light receiving front surface of the sheet has a plurality of resonance coupling periodicities, a plurality of correlation lengths, or a combination thereof, and the sheet has a modal volume (Vs), given by the volume of the sheet:

$$Vs=(n*2*\pi/\lambda)*height*width*sqrt(2\Delta s)$$

and is greater than or equal to (Vs≥Vf) the total modal volume (Vf) of the optical fibers given by:

$$Vf=N*n*2*\pi/\lambda*r^2*sqrt(2\Delta f)$$

where
N is the number of the fibers,
Δs (index of the sheet−1)/(index of the sheet) is the index delta of the sheet, Δf (index of the core−index of the clad)/(index of the core) is the index delta of the fibers, and the length and the roughness of at least one of the sheet's surface is sufficient to cause enough mode coupling so that at least 50% of the sheet's modal volume is filled.

2. The system of claim 1 further comprising a lens system situated between the sheet and at least one of the fibers.

3. The system of claim 1 further comprising a second roughened back surface.

4. The system of claim 3 further comprising the second roughened back surface being mirrored.

5. The system of claim 4 further comprising having 2 to 3 edges of the sheet mirrored and having the fibers are attached to the 2 to 1 un-mirrored edges.

6. The system of claim 1 wherein the plurality of optical fibers attached to at least one edge of the flat collecting sheet comprise about 10 to about 90% of the available surface area.

7. The system of claim 1 wherein the plurality of optical fibers attached to at least one edge of the flat collecting sheet comprises a close packed array.

8. The system of claim 1 wherein the plurality of optical fibers are attached to two or more edges of the flat collecting sheet.

9. The system of claim 1 wherein the plurality of optical fibers are attached to all edges of the flat collecting sheet and the fibers are closely packed.

10. The system of claim 1 wherein the flat collecting sheet comprises at least one of a transparent or translucent glass, a transparent or translucent plastic, a transparent or translucent composite, or a combination thereof.

11. The system of claim 1 wherein the plurality of optical fibers are attached to an edge of the flat collecting sheet by end-butting the fibers against the sheet edge.

12. The system of claim 11 further comprising a holder to positionally fix the fibers against the sheet edge.

13. The system of claim 1 wherein the first roughened light receiving front surface has a roughness of from about 50 to about 500 nanometers.

14. The system of claim 1 wherein the plurality of resonance coupling periodicities comprise a periodicity of from about 250 nanometers to about 10 microns.

15. The system of claim 1 wherein the plurality of correlation lengths comprise a group of frequencies having a short period of from about 0.5 to about 1 microns, and a long period of from about 5 to about 10 microns.

16. The system of claim 1 wherein the flat collecting sheet has surface mechanical frequencies of from about 0.25 to about 20 microns.

17. A method of light collection and light guidance using the system of claim 1, comprising:

exposing the system of claim 1 to ambient sun light;

collecting a portion of the sun light contacting the system within the flat collecting sheet;

channeling a portion of the collected light to at least one of the plurality of optical fibers attached to at least one edge of the flat collecting sheet; and distributing the channeled collected light to a remote location.

\* \* \* \* \*